(12) United States Patent
Lee et al.

(10) Patent No.: US 6,543,674 B2
(45) Date of Patent: Apr. 8, 2003

(54) MULTILAYER INTERCONNECTION AND METHOD

(75) Inventors: Michael G. Lee, San Jose, CA (US); Connie M. Wong, Fremont, CA (US); Wen-chou Vincent Wang, Cupertino, CA (US)

(73) Assignee: Fujitsu Limited (JP)

( * ) Notice: Subject to any disclaimer, the term of this patent is extended or adjusted under 35 U.S.C. 154(b) by 0 days.

(21) Appl. No.: 09/778,658

(22) Filed: Feb. 6, 2001

(65) Prior Publication Data

US 2002/0104873 A1 Aug. 8, 2002

(51) Int. Cl.$^7$ ............................................. B23K 31/02
(52) U.S. Cl. ................... 228/180.22; 228/164; 228/215
(58) Field of Search ........................... 228/180.22, 214, 228/215, 164, 170, 171, 172, 173.1, 173.2; 257/737, 738; 438/613, 614

(56) References Cited

U.S. PATENT DOCUMENTS

| 4,376,505 A | 3/1983 | Wojcik ........................ 228/215 |
| 4,724,472 A | 2/1988 | Sugimoto et al. ........... 257/697 |

(List continued on next page.)

FOREIGN PATENT DOCUMENTS

JP    407169790 A    *    7/1995

OTHER PUBLICATIONS

US 2002/0043726 A1 Salman et al. (Apr. 18, 2002).*
US 2002/0020927 A1 Akram et al. (Feb. 21, 2002).*
B.G. Ateya et al., "The effects of potential and kinetic parameters on the formation of passivating noble metal rich surface layers during the selective dissolution of binary alloys" *Corrosion Science*, vol. 38, No. 8, pp. 245–1267 (1996).

Makoto Kinosita, "BGA Bump Printing Technology With an Eximer Laser Mask," Hyoomen Jisso Gijutsu (Surface Mount Packaging Technology), Mar. 1997, pp. 16–20.

*Primary Examiner*—Tom Dunn
*Assistant Examiner*—Kiley Stoner
(74) *Attorney, Agent, or Firm*—Coudert Brothers LLP

(57) ABSTRACT

A method for electrically coupling electrode pads comprising forming a reflowed solder bump on a first electrode pad supported by a first substrate. The reflowed solder bump includes a solder material having a solder melting temperature. The method further includes forming a second electrode pad on a second substrate. The second electrode pad has an electrode structure defined by at least one converging continuous arcuate surface terminating in an apex and having an electrode material whose melting temperature is greater than the solder melting temperature of the solder material. The solder bump is heated to reflow or to soften the solder material, and subsequently the apex of the second electrode pad is pressed or inserted into the heated solder bump to couple the first electrode pad to the second electrode pad. A method for solder bump reflow comprising pressing or inserting the apex of an electrode into a reflowed solder bumps, and then reflowing solder material of the reflowed solder bump. A semiconductor assembly including a semiconductor device having an electrode pad coupled to a semiconductor substrate and comprising an electrode structure defined by a pair of arcuate surfaces generally tangentially terminating in an apex.

19 Claims, 9 Drawing Sheets

Piercing of pointy bond pads into solder bump

U.S. PATENT DOCUMENTS

| | | | |
|---|---|---|---|
| 4,739,917 A | 4/1988 | Baker | 228/123.1 |
| 4,927,372 A | 5/1990 | Collier | 439/83 |
| 4,955,523 A | 9/1990 | Carlommagno et al. | 228/180.5 |
| 5,132,772 A | 7/1992 | Fetty | 257/779 |
| 5,164,818 A | 11/1992 | Blum et al. | 257/778 |
| 5,406,458 A | 4/1995 | Schutt | 361/767 |
| 5,447,871 A | 9/1995 | Goldstein | 438/618 |
| 5,481,205 A | 1/1996 | Frye et al. | 324/757 |
| 5,483,741 A | 1/1996 | Akram et al. | 29/846 |
| 5,506,514 A | 4/1996 | Difrancesco | 324/757 |
| 5,508,561 A | 4/1996 | Tago et al. | 257/737 |
| 5,579,573 A | 12/1996 | Baker et al. | 29/840 |
| 5,600,180 A | 2/1997 | Kusaka et al. | 257/692 |
| 5,611,481 A | 3/1997 | Akamatsu et al. | 228/180.22 |
| 5,633,204 A | 5/1997 | Tago et al. | 438/614 |
| 5,640,052 A | 6/1997 | Tsukamoto | 257/781 |
| 5,641,113 A | 6/1997 | Somaki et al. | 228/180.22 |
| 5,667,132 A | 9/1997 | Chirovsky et al. | 228/180.22 |
| 5,705,858 A | 1/1998 | Tsukamoto | 257/778 |
| 5,731,066 A | 3/1998 | Ando et al. | 428/210 |
| 5,736,790 A | 4/1998 | Iyogi et al. | 257/780 |
| 5,821,627 A * | 10/1998 | Mori et al. | 257/737 |
| 5,831,441 A * | 11/1998 | Motooka et al. | 324/754 |
| 5,843,251 A * | 12/1998 | Tsukagoshi et al. | 156/295 |
| 5,848,466 A * | 12/1998 | Viza et al. | 156/243 |
| 5,854,558 A * | 12/1998 | Motooka et al. | 324/754 |
| 5,877,079 A * | 3/1999 | Karasawa et al. | 438/613 |
| 5,971,253 A * | 10/1999 | Gilleo et al. | 228/104 |
| 5,975,408 A * | 11/1999 | Goossen | 228/173.2 |
| 6,037,786 A * | 3/2000 | Palagonia et al. | 324/754 |
| 6,051,093 A * | 4/2000 | Tsukahara | 156/251 |
| 6,113,728 A * | 9/2000 | Tsukagoshi et al. | 156/264 |
| 6,163,463 A * | 12/2000 | Marrs | 228/180.22 |
| 6,179,198 B1 * | 1/2001 | Eifuku et al. | 228/103 |
| 6,204,089 B1 * | 3/2001 | Wang | 438/108 |
| 6,219,911 B1 * | 4/2001 | Estes et al. | 29/740 |
| 6,244,499 B1 * | 6/2001 | Tsai et al. | 228/180.5 |

\* cited by examiner

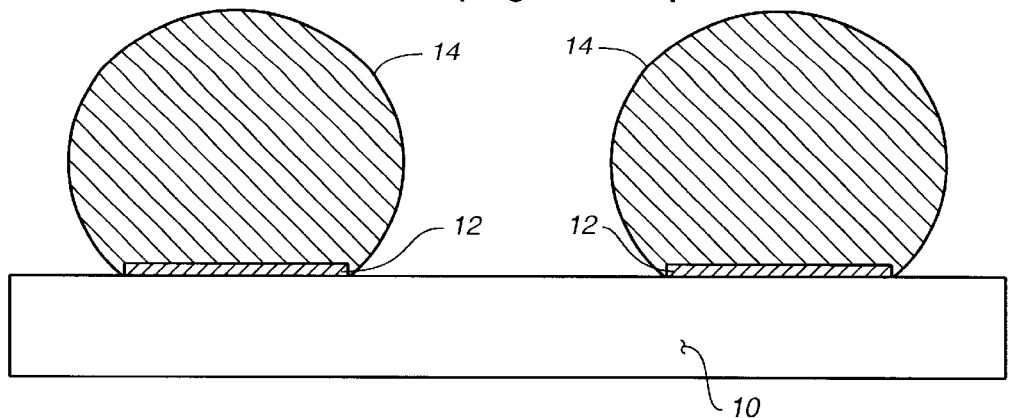
FIG._1
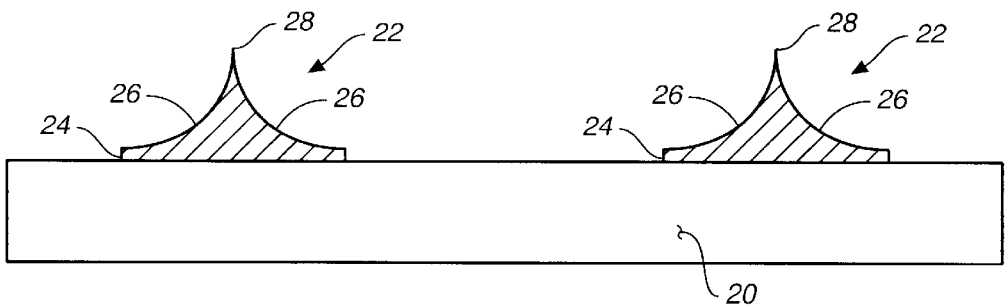
FIG._2
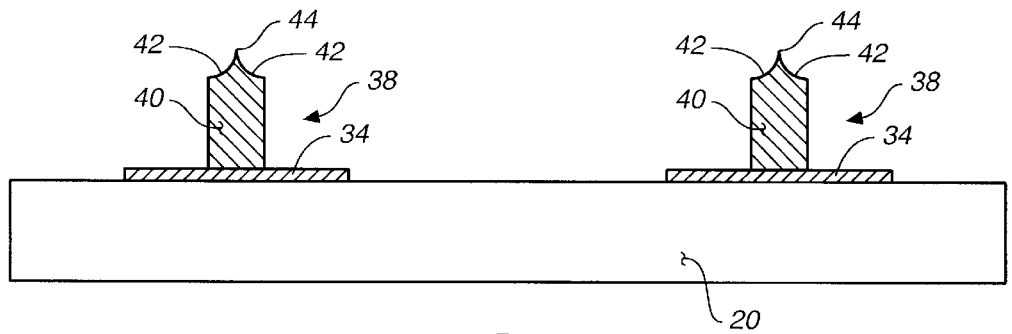
FIG._3

Formation of pointy pads: (1) deposition of bond pad
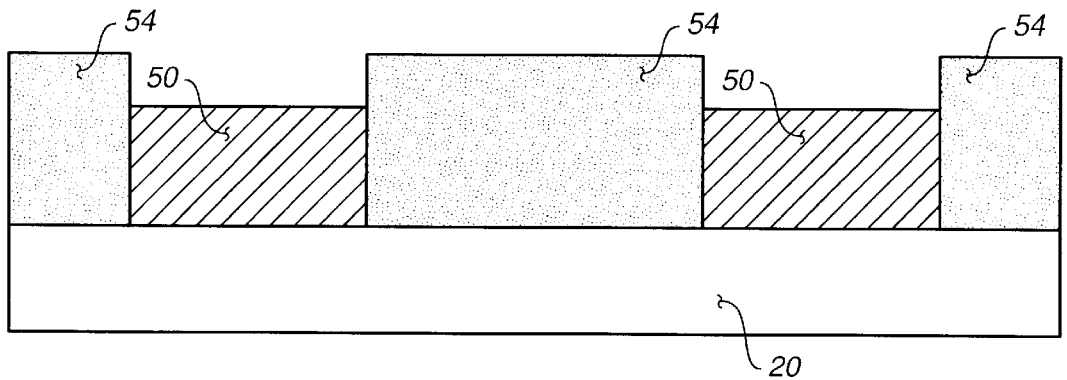
FIG._4
Formation of pointy pads: (2) placement of stencil
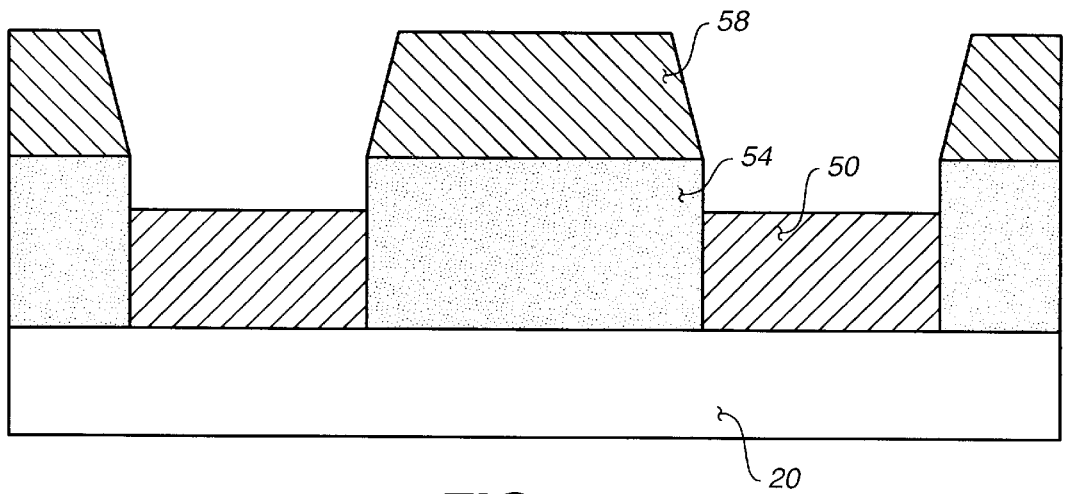
FIG._5

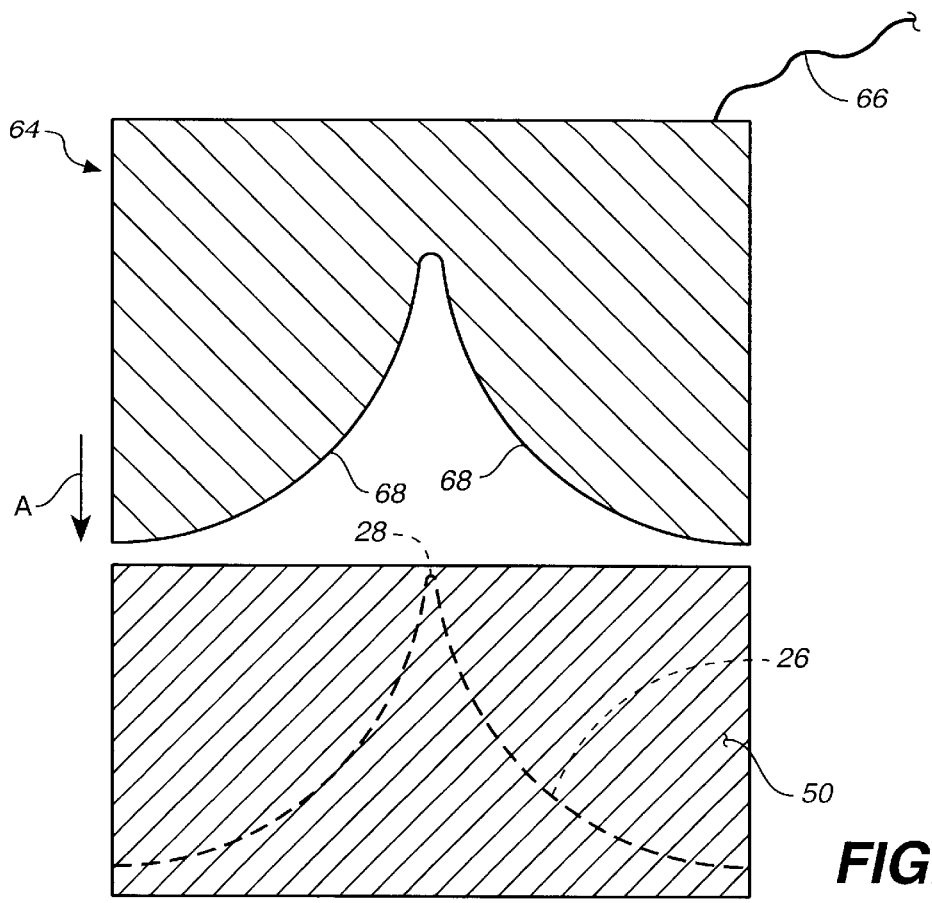
FIG._6
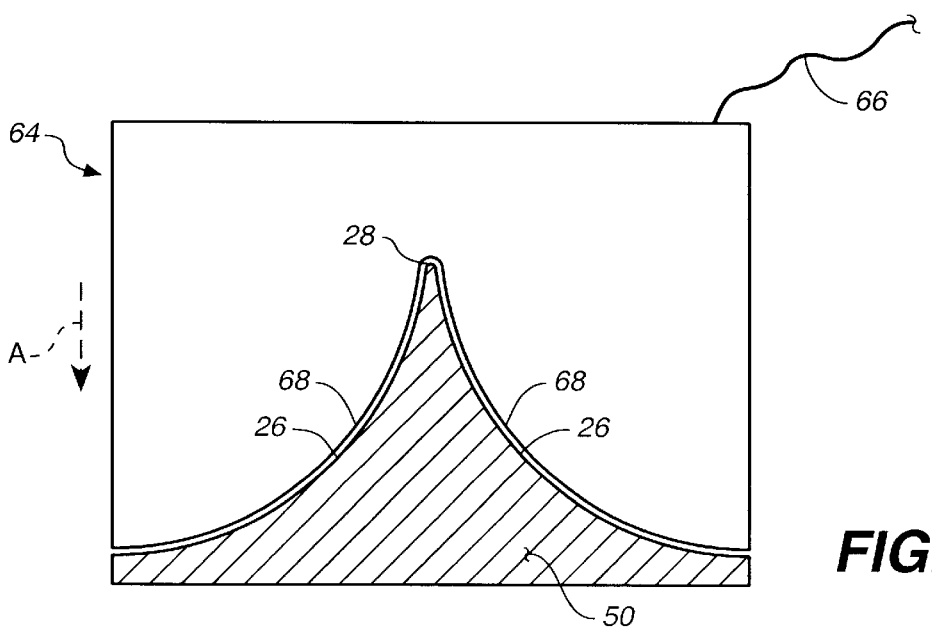
FIG._7

Piercing of pointy bond pads into solder bump
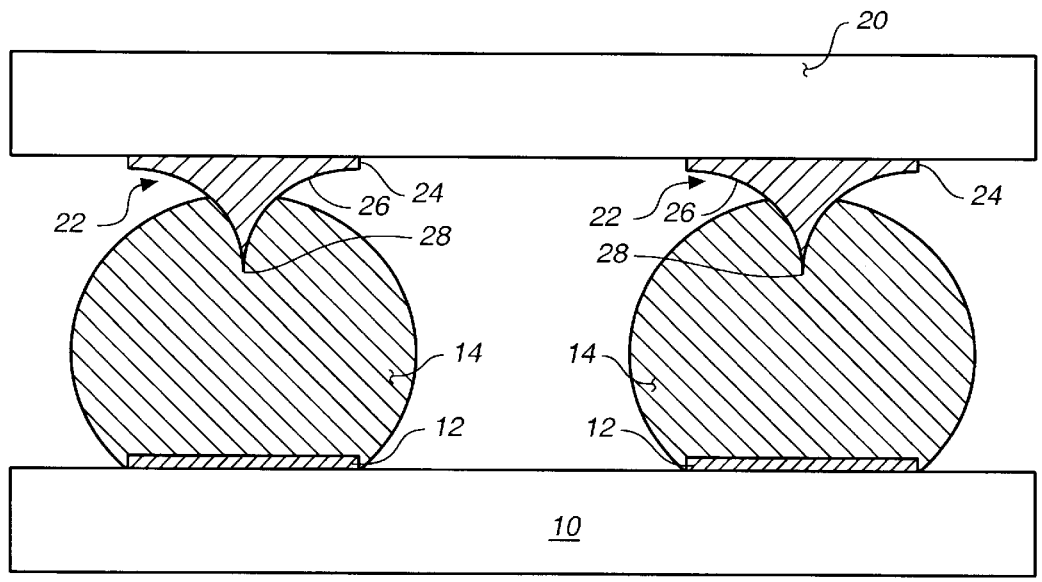
FIG._8
Solder joint after piercing
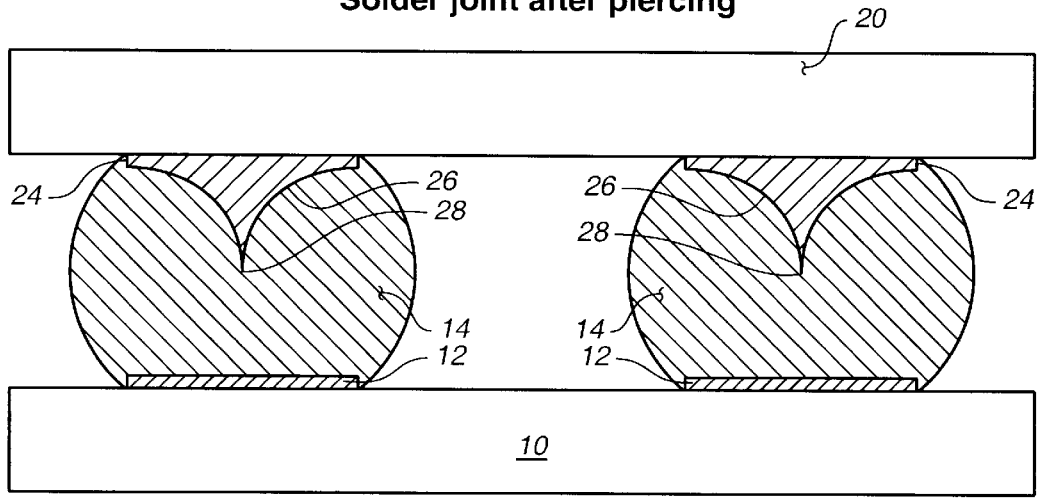
FIG._9

Placement of underfill dielectric
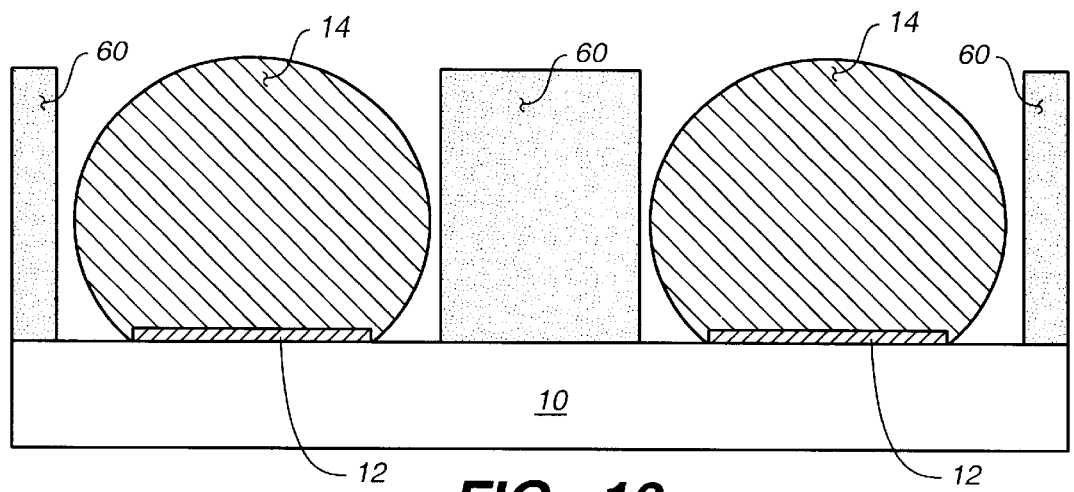
FIG._10
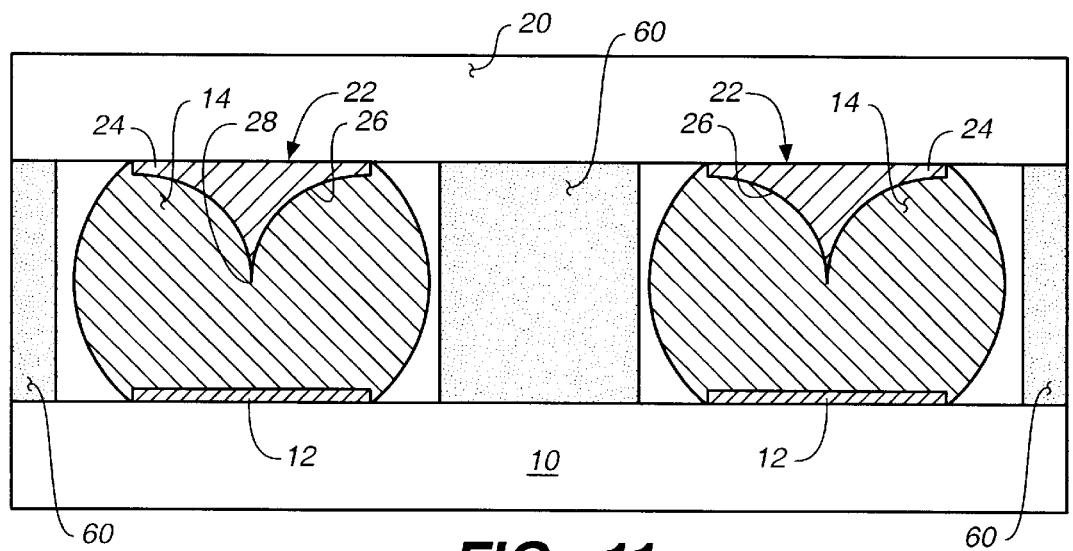
FIG._11

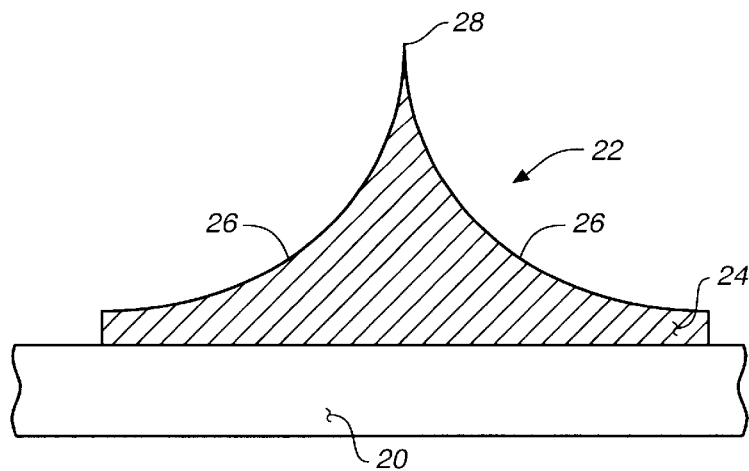
*FIG._12*
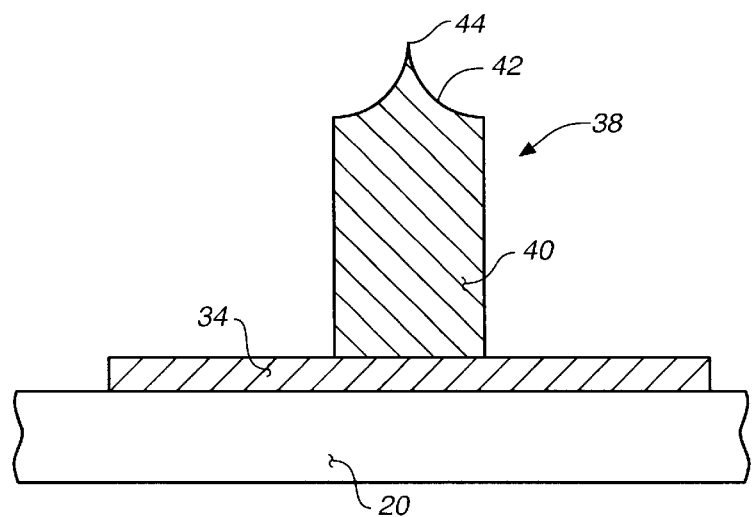
*FIG._13*
Joints with underfill dielectric
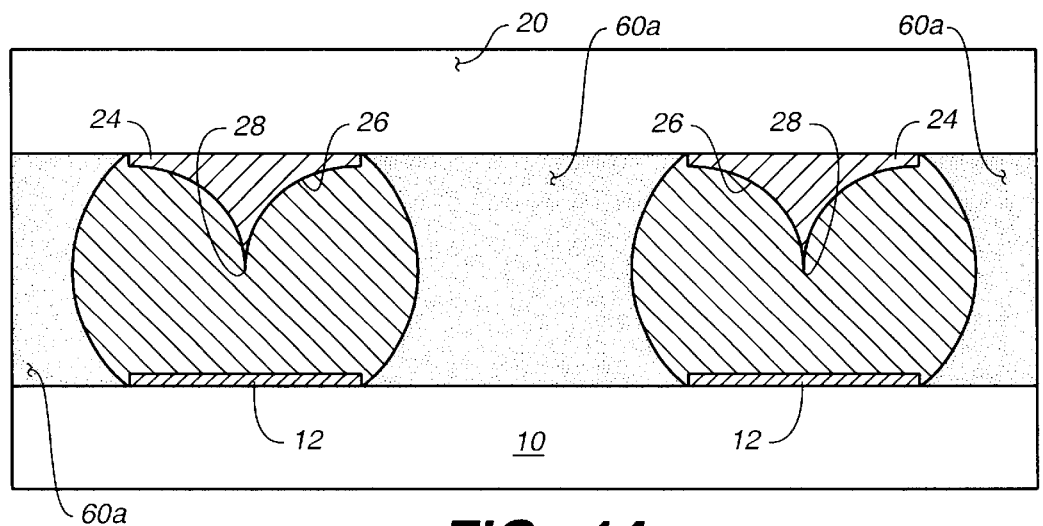
*FIG._14*

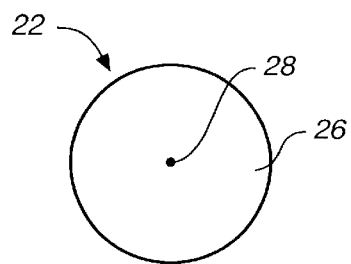
FIG._15
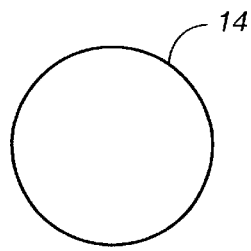
FIG._16
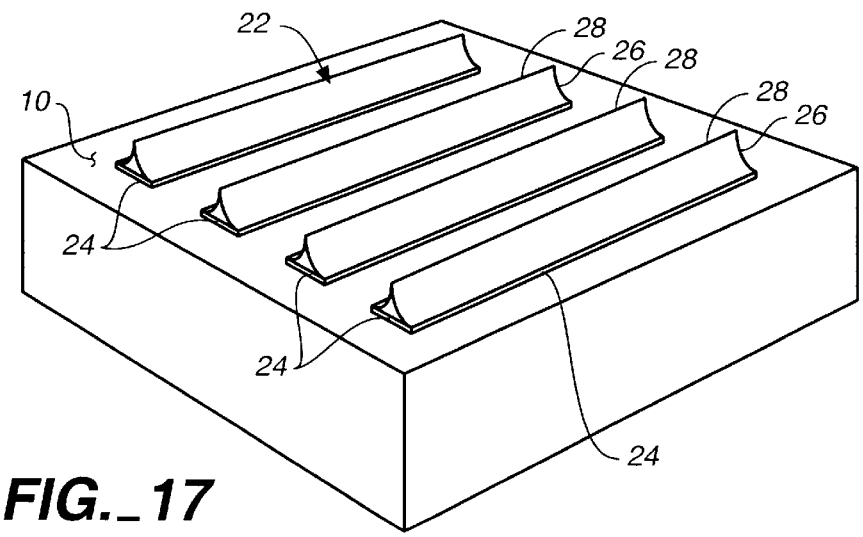
FIG._17
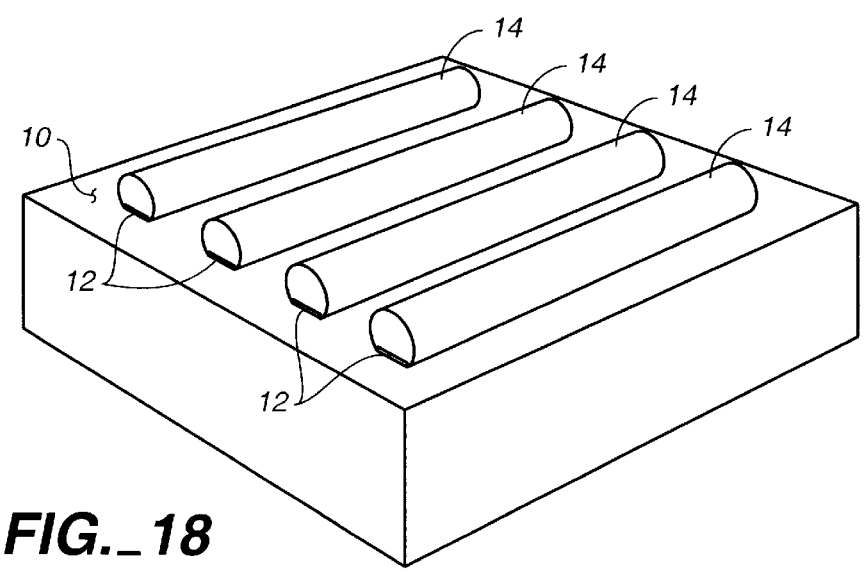
FIG._18

Formation of pointy pads: (1) deposition of bond pads
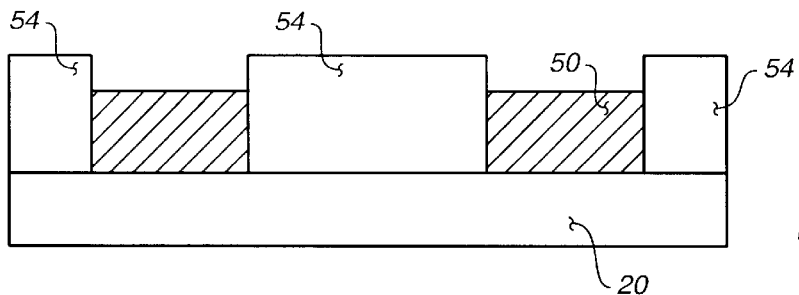
FIG.\_19
Formation of pointy pads: (2) placement of stencil on sample
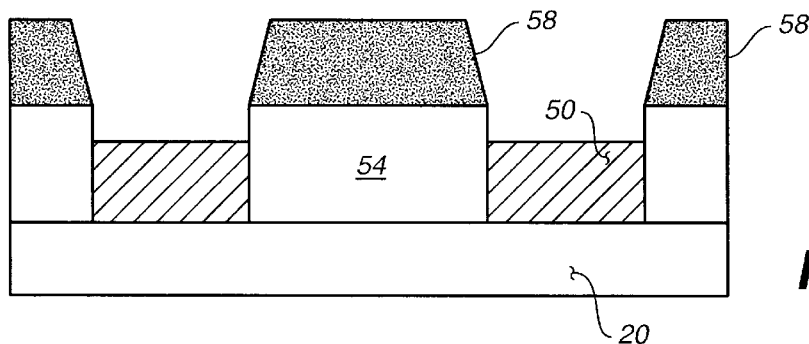
FIG.\_20
Formation of pointy pads: (3) immerse in electrolyte solution and apply electric current
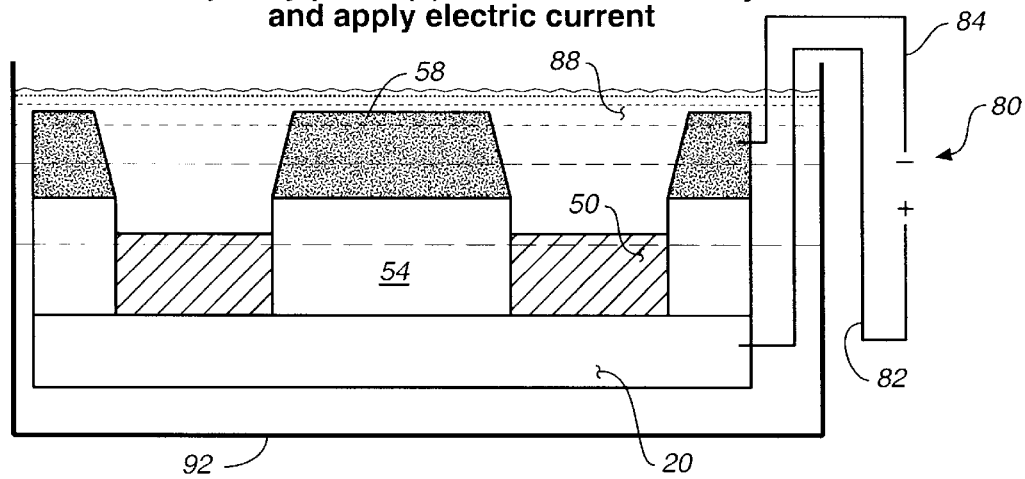
FIG.\_21

Formation of pointy pads: (4) preferentially dissolving due to distance difference
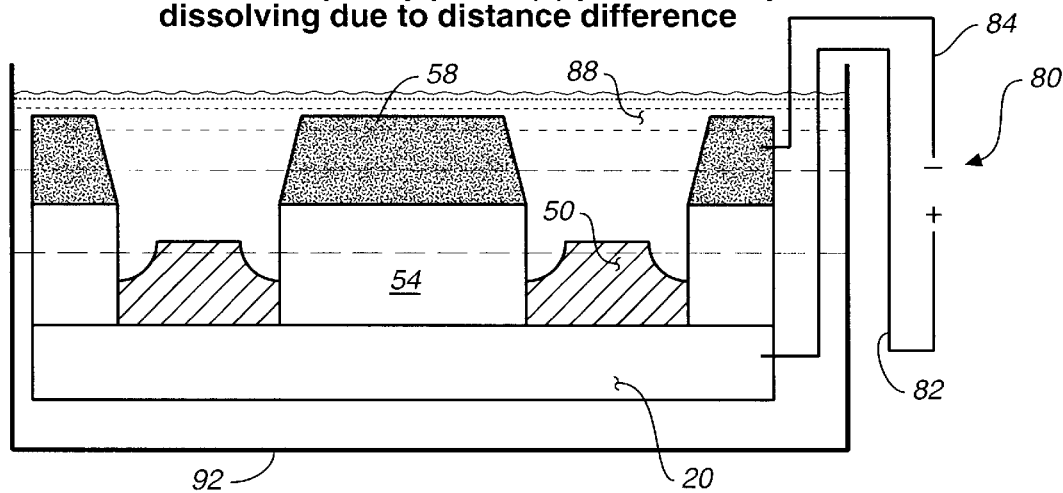
FIG._22
Formation of pointy pads: (5) formation of pointy tip with arcuate side
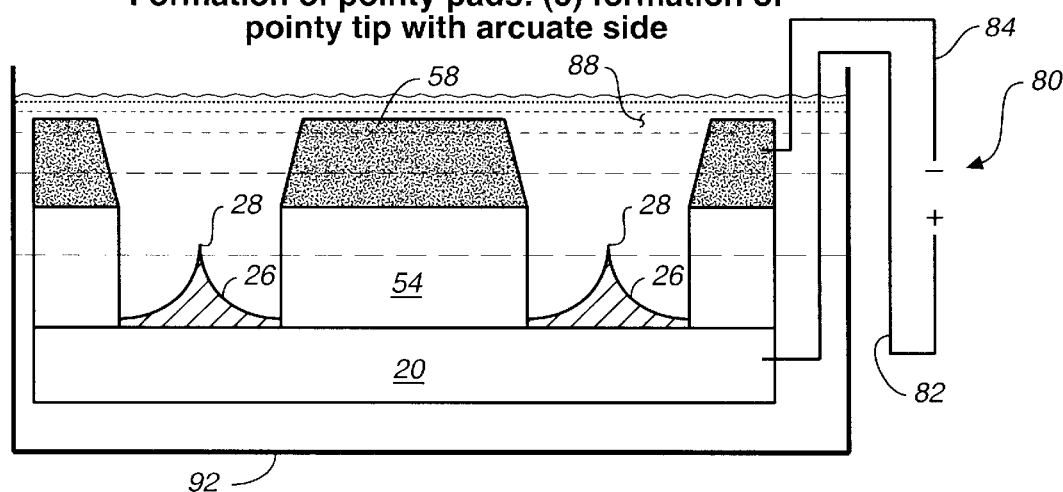
FIG._23
Formation of pointy pads: (6) remove stencil and resist
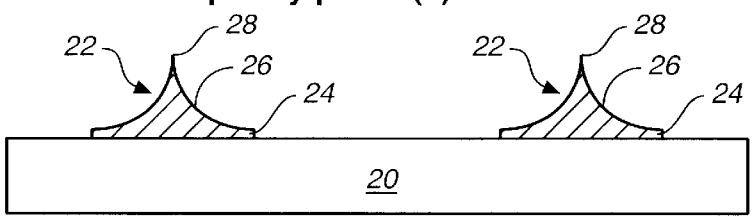
FIG._24

MULTILAYER INTERCONNECTION AND METHOD

BACKGROUND OF THE INVENTION

1. Field of the Invention

The present invention relates to electrical interconnections for circuit boards and the like. More particularly, the present invention provides for coupling electrode pads of semiconductor devices to circuit boards, and for a structure for packaging semiconductor devices. The present invention also provides a method for fabricating an electronic device and for soldering techniques or procedures in the process of fabricating a semiconductor device having solder joints.

2. Description of the Prior Art

Semiconductor device packages or integrated circuit (IC) chips may, in general, operate by means of being mounted on a substrate, such as a printed circuit substrate which comprises an interconnection pattern for a circuit to be assembled, to electrically connect with other electrical/electronic devices (e.g., resistors, capacitors, ICs). For the purpose of electrically connecting to other such devices over the interconnection pattern, the semiconductor device packages or the IC chips comprise a number of external electrodes, while the interconnection pattern on the substrate contains a number of contact pads to be connected to the external electrodes of the semiconductor device packages or of the IC chips. Various methods for electrically connecting semiconductor device packages or IC chips to printed circuit substrates are well known in the art. An electrically-conductive bond (e.g., a solder bump) may be used to mechanically and electrically connect to a printed circuit substrate.

In recent years, leadless packages, also known as chip carriers, have come into increasing use for accommodating integrated circuits (IC), large-scale integrated circuits (LSI), and the like. Like conventional packages with outer leads, leadless packages accommodate an IC chip therein and outer pads of the leadless package are electrically connected to the substrate and circuit board by soldering. They therefore can be used in popular assembly processes. At the same time, provision of conductor pads as outer pads in place of outer leads enables a more compact structure. Therefore, such packages can be mounted at a higher density on a substrate, compared with other packages. This feature has resulted in.leadless packages being widely used in a broad range of fields.

There is, however, a problem with mounting the package to the substrate and circuit board by a rigid soldering technique in that the electrical connections tend to fracture as a result of thermal cycling. Normally, the package, substrate, and circuit board are formed of different materials having different coefficients of expansion. During the heating required to accomplish the mounting and during normal operating conditions, the package, substrate, and the circuit board contract and expand at different rates, thereby generating stresses. These stresses can fracture the package, substrate, circuit board, or soldered conductor pads. The problem is compounded the greater the size of the devices.on the circuit board. Such breakage, of course, has a fatal effect oh the operation of the electronic circuits formed on the circuit board. There is also the problem in the soldering technique in that after reflowing the solder for electrically connecting joints, the solder joint should be cleaned. Traditionally, cleaning after soldering is not easy when flux is employed after solder reflow. Therefore, what is needed and what has been invented inter alia is a method for coupling or joining together a solder electrical connection in a process of fabricating a semiconductor assembly having solder joints.

SUMMARY OF THE INVENTION

An embodiment of the present invention provides a method for electrically coupling electrode pads comprising the steps of:
(a) forming a reflowed solder bump having a solder material with a melting temperature and disposed on a first electrode pad supported by a first substrate;
(b) forming a second electrode pad on a second substrate, such that the second electrode pad includes an electrode structure defined by at least one converging continuous arcuate surface terminating in an apex and having an electrode material whose melting temperature is greater than the melting temperature of the solder material;
(c) heating the solder bump to soften the solder material; and
(d) pressing the apex of the second electrode pad into the heated solder bump to couple the first electrode pad to the second electrode pad.

The immediate foregoing method preferably additionally comprises disposing an underfill material on the first substrate prior to heating step (c). The underfill material is preferably heated after pressing step (d), and includes a reflow temperature that is lower than its curing temperature. The underfill material also preferably comprises a curing temperature that is higher than a reflow temperature of the solder material. Heating of the underfill material preferably expands the underfill material, and after the underfill material cools, the cooled underfill material remains at least partially expanded. The forming step (b) preferably comprises selectively removing (e.g., by electro-dissolution) electrode material from a layer of electrolyte-immersed electrode material which composes the second electrode pad. Alternatively, the forming step (b) employs a die or mold which is capable of being heated (e.g., electrically) to melt electrode material until the second electrode pad is formed with the desired shape. The die or mold includes an internal surface which mirrors the arcuate surface terminating in the apex. Any two continuous lines along the at least one converging continuous arcuate surface tangentially meet.

Another embodiment of the present invention provides for a semiconductor assembly comprising a first semiconductor substrate; a first electrode pad connected to the first semiconductor substrate; and a reflowed solder bump supported by the first electrode pad. The semiconductor assembly also includes a second semiconductor substrate and a second electrode pad coupled to the second semiconductor substrate. The second electrode pad is at least partially embedded in the reflowed solder bump and has an electrode structure defined by at least one converging continuous arcuate surface terminating in an apex. When the electrode structure is defined by a pair of opposed continuous arcuate surfaces, the continuous arcuate surfaces tangentially terminate in an apex.

A further embodiment of the present invention provides a semiconductor device comprising a semiconductor substrate, and an electrode pad coupled to the semiconductor substrate and comprising an electrode structure defined by at least one converging continuous arcuate surface terminating in an apex. Another electrode pad may be connected to the semiconductor substrate and to the electrode pad such as to be disposed between the semiconductor substrate and the electrode pad.

Additionally embodiments of the present invention also provide a method for solder bump reflow comprising the steps of:
(a) forming a reflowed solder bump having a solder material with a melting temperature and disposed on a first electrode pad supported by a first substrate;
(b) forming a second electrode pad on a second substrate, such that the second electrode pad includes an electrode structure defined by at least on converging continuous arcuate surface terminating in an apex and having an electrode material whose melting temperature is greater than the melting temperature of the solder material;
(c) pressing the apex of the second electrode pad into the reflowed solder bumps; and
(d) reflowing the solder material of the reflowed solder bump.

These provisions, together with the various ancillary provisions and features which will become apparent to those skilled in the art as the following description proceeds, are attained by this novel assembly and method, a preferred embodiment thereof shown with reference to the accompanying drawings, by way of example only, wherein:

BRIEF DESCRIPTION OF THE DRAWINGS

FIG. 1 is a side elevational view of a substrate having connected thereto electrode pads, each of which supports a solder bump;

FIG. 2 is a side elevational view of a substrate having bonded thereto one embodiment of electrode pads for the present invention;

FIG. 3 is a side elevational view of a substrate having bonded thereto a pair of electrode pads, each of which is supporting a post-like conductor pin;

FIG. 4 is a schematic view of a step of depositing the material which is to formulate the embodiment of the electrode pads illustrated in FIGS. 2 and 12;

FIG. 5 is a schematic view of another step in formulating the embodiment of the electrode pad of FIGS. 2 and 12;

FIG. 6 is a vertical sectional view of a die or mold disposed on a block of material which forms the electrode pad of FIGS. 2 and 12;

FIG. 7 is a vertical sectional view of the die or mold of FIG. 6 after the die or mold has selectively removed portions (e.g., by melting) of material from the block of material of FIG. 6 to produce the electrode pad of FIGS. 2 and 12;

FIG. 8 is a vertical sectional view of the solder bumps and of the embodiment of the electrode pads of FIGS. 2 and 12 after the point of a respective electrode pad has pierced the oxide layer of a respective solder bump;

FIG. 9 is a vertical sectional.view of the electrode pads and the solder bumps of FIG. 8 after the top substrate which supports the electrode pads has been lowered further such that the exposed exterior surfaces of the electrode pads have been encapsulated by the solder bumps;

FIG. 10 is a side elevational sectional view of the solder bumps of FIG. 1 after dielectric underfill has been disposed on opposite sides of the solder bumps;

FIG. 11 is a side elevational sectional view of dielectric underfill and solder bumps of FIG. 10 have been brought into a contact relationship with a substrate having secured thereto the electrode pad of FIGS. 2 and 12 and with each solder bump having imbedded therein the electrode pad of FIGS. 2 and 12;

FIG. 12 is an enlarged vertical sectional view of the electrode pad of FIG. 2;

FIG. 13 is an enlarged vertical sectional view of the electrode pad of FIG. 3 including a post-like conductor pin; and FIG. 14 is a side elevational sectional view of the assembly of FIG. 11 after the dielectric underfill has been heated and cured to fill all of the voids between and next to the solder bumps.

FIG. 15 is a top plan view of one embodiment of the electrode pad;

FIG. 16 is a top plan view of one embodiment of the solder bump;

FIG. 17 is a perspective view of another embodiment of the electrode pads;

FIG. 18 is a perspective view of another embodiment of the solder bumps;

FIG. 19 is another schematic view of a step of depositing the material which is to formulate the embodiment of the electrode pads illustrated in FIGS. 2 and 12;

FIG. 20 to is another schematic view of an additional step for formulating the embodiment of the electrode pads illustrated in FIGS. 2 and 12;

FIG. 21 is a side elevational view of the structure of FIG. 20 coupled to an electrical power source and immersed in an electrolyte solution;

FIG. 22 is a side elevational view of the structure of FIG. 21 after electric current has been applied to the structure to commence preferentially dissolving the material of the electrode pads in proximity to the resist and stencil;

FIG. 23 is a side elevational view of the structure of FIG. 22 after all of the intended material of the electrode has been dissolved in the electrolyte such that at least one generally continuous arcuate surface has been formulated which terminates in an apex or pointy tip; and FIG. 24 is a side elevational view of the structure of FIG. 23 after the stencil and resist has been removed to produce the embodiment of the electrode pads of FIGS. 2 and 12 supported by a substrate.

DETAILED DESCRIPTION OF PREFERRED EMBODIMENTS

Referring in detail now to the drawings, there is seen in FIG. 1 a substrate 10 (e.g., a circuit board or semiconductor element) having connected or bonded thereto a pair of electrode pads 12—12, which may be composed of any suitable metal component, such as aluminum or copper. Each of the electrode pads 12—12 has a solder bump 14 which also may be composed of any suitable metal component, preferably a mixture of lead (Pb) and tin (Sn) or any suitable eutectic composition. Solder bumps 14—14 may have any geometric shape such as a spheroid as seen in the top plan view of FIG. 16, or an elongated cylinder-like structure as illustrated in the perspective view of FIG. 18. The solder bumps 14—14 may be formed by any suitable method, such as by stencil printing ("stenciling flux"). By way of example only, vapor deposition may be employed to dispose a layer of the soldering material which forms the solder bumps 14—14. Subsequently, the soldering material is heated to its softening or melting temperature ("reflow temperature"), after which the solder bumps 14—14 become generally spherical in vertical cross section due to its surface tension. Solder bumps 14—14 typically have an oxide layer on the surface as a result of air contact. The soldering material may be heated without flux, such as in atmospheric gas consisting of nitrogen and/or argon. The melting temperature of the solder bumps 14—14 is preferably lower than that of the electrode pads 12—12.

Referring now to FIG. 2 there is seen substrate 20 (e.g., a circuit board or semiconductor element) having connected or bonded thereto a pair of electrode pads, each generally illustrated as 22. Electrode pads 22—22 may be manufactured from any suitable conductive metal, such as copper, preferably having a melting point higher, or at a greater temperature, than the melting point or temperature of the soldering material which forms solder bumps 14—14. Stated alternatively, the metal which composes the electrode pads 22—22 is preferably harder than the soldering material which composes the solder bumps 14—14. In a preferred embodiment of the invention each of the electrode pads 22 has a base 24 and at least one converging continuous arcuate surface 26 terminating in apex 28. In one embodiment of the electrode pad 22 there is a single converging continuous arcuate surface 26 (see top plan view of FIG. 15) terminating in apex 28. Any two continuous lines along continuous arcuate surface 26 tangentially meet in apex 28. In another embodiment of the electrode pad 22 as best shown in FIG. 17, there are two concave, arcuate surfaces 26—26 which terminate in apex 28 (see FIGS. 2 and 12). For purposes of explaining and describing various embodiments of the present invention, the embodiments of FIGS. 17 and 18 will be used. However, it is to be understood that any explanation and description with respect to FIGS. 17 and 18 also pertains to other embodiments of the present invention, such as the embodiment of FIGS. 15 and 16 which also falls within the scope of the claims.

Apices 28—28 preferably have a diameter (or width) ranging from about 1.0 μm to about 5.0 μm. The concave or arcuate surfaces 26—26 are preferably continuous in a sense that surfaces 26—26 continuously extend inwardly while rising upwardly towards apex 28. The surfaces 26—26 are generally tangential with respect to each other at apex 28. Thus, the arcuate integrity, of the surfaces 26—26 is not interrupted. This enables a larger portion of the solder bumps 14—14 to be in closer proximity to the base 24 (and thus to the substrate 20) than if the arcuate surfaces 26—26 were not provided, or were not rising continuously inwardly and upwardly with confidence from the base 24. It is believed that perhaps this improves the electrical connection between substrates 10 and 20.

In another preferred embodiment of the invention and as best shown in FIG. 3, substrate 20 is seen as having connected thereto, electrode pads 34—34 which may be manufactured from any conductive material, such as copper. Connected to each of the electrode pads 34—34 is a conductor pin, each generally illustrated at 38. Preferably each conductor pin 38 includes a base 40 and concave, arcuate surfaces 42—42 that terminate in apex 44 (see FIGS. 3 and 13). Apices 44—44 preferably have a diameter (or width) ranging from about 1.0 μm to about 5.0 μm. The conductor pins 38—38 may be manufactured from any suitable conductive material which preferably has a melting point higher, or a greater temperature, than the melting point of the soldering material which forms solder bumps 14—14. Stated alternatively, the metal which composes the conductor pin 38 is preferably harder than the soldering material which composes the solder bumps 14—14. Concave and/or arcuate surfaces 42—42 are similar to concave, arcuate surfaces 26—26 in that surfaces 42—42 continuously extend inwardly while rising upwardly towards apex 44. Thus, the arcuate integrity of the surfaces 26 is not interrupted, enabling a larger portion of the solder bumps 14—14 to be in closer proximity to the base 40 (and thus to the electrode pad 34 and the substrate 20), and, upon belief, improving the electrical connection between substrates 10 and 20. Surfaces 42—42 are preferably generally tangential with respect to each other at apex 44. As previously indicated, the electrode pad 34 of FIG. 3 may be elongated as the electrode pad 22 is in FIG. 17; thus, conductor pin 38 and base 40 would be rectangular block-like. Alternatively, conductor pin 38 and base 40 may be post-like in shape and there would be a single arcuate surface 26 as was seen for electrode pad 22.

Referring now to FIGS. 4–7 for explaining a preferred procedure for producing the electrode pad 22, the material (identified as "50" in FIG. 4) from which the electrode pad 22 is constructed, is initially disposed on substrate 20 by any suitable procedure, such as by a conventional lithographic process employing resists or masks 54 (see FIG. 4) followed by disposing a stencil (or any other suitable resist) 58 on top of the resistor mask 54. Subsequently, portions of the material 50 are to be selectively removed to produce the electrode pad 22 of FIGS. 2 and 12. In a preferred embodiment of the invention, selective portions of the material 50 is removed by electro-dissolution as disclosed in a book entitled *Electroplating* by Frederick A. Lowenheim (publisher: McGraw-Hill Book Co., 1978), and in a book entitled *Modern Electroplating*, edited by Frederick a. Lowenheim (publisher: John Wiley & Sons, Inc., 1974), both of which are fully incorporated herein by reference thereto. The process of electro-dissolution is also disclosed in an article entitled "The Effects of Potential and Kinetic Parameters on the Formation of Passivating Noble Metal Rich Surface Layers During the Selective Dissolution of Binary Alloys," to B.G. Ateya et al., *Corrosion Science*, Vol. 38, No. 8, pp.245–1267 (1996), also fully incorporated herein by reference thereto.

Alternatively, as shown in FIG. 6, the rectangular block of material 50 is superimposed with a mold or die, generally illustrated as 64, having a depending conductor 66 coupled thereto and to an electrical source (not shown). The die 64 is capable of being heated to melt selective portions of the material 50, and has been formed to have an internal surface 68 which mirrors the concave, arcuate surfaces 26 and apex 28. Stated alternatively, die 64 is provided to have internal or inside surface 68 whose contour represents the external shape of the electrode pad 22; that is, the electrode pad 22 having the concave, arcuate surfaces 26—26 terminating in the apex 28. If electrode pad 22 has only one arcuate surface 26, internal or inside surface 68 of die 64 would mirror single arcuate surface 26.

After the die 64 have been contactly disposed on the block of material 50, current is conducted to die 64 via conductor 66 in order to heat the die and commence the selective process of removing the material 50 required to formulate the dashed line representation of the electrode pad 22, as seen in FIG. 6, or the solid line representation of the electrode pad 22, as best shown in FIGS. 2 and 12. As material 50 is being melted, die 64 moves downwardly and in direction of arrow A of FIG. 6 until reaching the position shown in FIG. 7 (i.e., the dashed line representation of electrode pad 22 illustrated in FIG. 6). As the material 50 is melted it is removed by gravitational flow, or the like, or any other suitable process. After the electrode pad 22 has been produced with the desired shape of FIGS. 2 and 12, die 64 is removed. It is readily apparent to those possessing the ordinary skill in the art that the electrode pads 34—34 may be produced similarly.

Referring now to FIGS. 19–24 for another preferred electro-dissolution procedure for producing the electrode pad 22, material 50 again is initially disposed, on substrate 20 (e.g., a silicon substrate with sputtered thin conductive layer(s)) by a conventional lithographic process employing photoresist or masks 54 followed by disposing stencil 58 (e.g., stainless steel stencil) on top of the masks 54 (see FIGS. 19 and 20). The structure of FIG. 20 is subsequently coupled to an electrical power sources (e.g., a battery), generally illustrated as 80 in FIGS. 21-23. Conductors 82 and 84 are respectively coupled to substrate 20 and to stencil 58 for passing an electric current through the stencil 58, an electrolyte 88, material 50, and the substrate 20 while immersed in the electrolyte 88 contained in a container 92. The electrolyte 88 is preferably an acid, such as sulfuric acid, hydrochloric acid or phosphoric acid. The amount of current density passing through stencil 58, the electrolyte 88, the material 50, and substrate 20 may be from about 50 amps/m$^2$ to about 2000 amps/m$^2$, preferably from about 500 amps/m$^2$ to about 1500 amps/m$^2$, most preferably from about 800 amps/m$^2$ to about 1200 amps/m$^2$. As well known in the art, current density is current in amperes per unit area of electrode. For various preferred embodiments of the present invention, at least the stencil 58 and resist 54 may represent and function as the electrode for current density purposes. As current passes through the foregoing indicated, the material 50 closest to stencil 58 and resist 54 preferentially commences to be dissolved in the electrolyte 88, as best shown in FIG. 22. As one of the preferred amounts of current (e.g., 1000 amps/m$^2$) continues to pass through stencil 58, the electrolyte 88, the material 50, and substrate 20 while immersed in electrolyte 88, the desired continuous generally arcuate surface 26 forms from the preferential electrodissolution, as best shown in FIG. 23. After the structure of FIG. 23 is removed from the electrolyte 88, and after stencil 58 and resist 54 are removed, the embodiment of the electropads 22—22 of FIGS. 2 and 12 is produced, supported by substrate 20.

After the electrode pads 22—22, or the electrode pads 34—34, have been produced in accordance with any of the previously mentioned procedures, they may be subsequently coupled to the solder bumps 14—14 by reflow; that is, liquefying or softening the solder bumps 14—14 by heating the substrate 10. The solder bumps 14—14 preferably reflow at a temperature ranging from about 150° C. to about 250° C. In a preferred embodiment of the invention, solder bumps 14—14 are only softened (not liquefied) at a temperature ranging from about 100° C. to about 200° C. By softening, solder bumps 14—14 do not lose the general circular in vertical cross section form or appearance, as illustrated in FIG. 8. After softening the solder bumps 14—14, the substrate 20 is lowered downwardly with sufficient force, enabling the tips or apices 28—28 of electrode pads 22—22 to pierce any oxide layer surrounding the solder bumps 14—14 and enter into the soldering bumps 14—14, as best shown in FIG. 8. By conducting the foregoing procedure, there would be no need of using flux to remove the surface oxide on the soldering bumps 14—14, because surface oxide is only on the exterior of the solder bumps 14—14 which are mechanically pierced by the apices 28—28 of electrode pads 22—22 when substrate 20 is lowered downwardly as previously mentioned.

After the piercing procedure the apices 28—28 and part of the inwardly arcuate, concave surfaces 26—26 are covered with the inside material (i.e., oxide free soldering material) as indicated in FIG. 8. Subsequently, the substrate 20 is continually lowered downwardly until all of the exterior portions of the arcuate surfaces 26—26 and the base 24 are circumscribedly surrounded-by the, soldering material of the solder bumps 14—14 as best shown in FIG. 9. Stated alternatively, the remaining exposed surfaces of the arcuate, concave surfaces 26—26 and the base 24 are gradually covered with the soldering material of the solder bumps 14—14 and then cooled by the procedure of continually, gradually lowering the substrate 20 until the posture of FIG. 9 is reached, followed by cooling the solder bumps 14—14 to form the intermetallic compounds defined by the conductive metal compound of the soldering material of the solder bumps 14—14 being coupled to the conductive compound of the electrode pads 22—22.

In another preferred embodiment of the present invention, the electrode pads 22—22, or the electrode pads 34—34, are coupled to the solder bumps 14—14 without initially reflowing (i.e., liquefying or softening) the soldering material of the solder bumps 14—14. Because an alternative embodiment of the present invention provides that the metal which composes the electrode pads 22—22, or the conductor pin 38—38, is harder than the soldering material (or soldering metal) which composes solder bumps 14—14, the apices 28—28 or apices 44—44 of electrode pads 22—22 or conductor pins 38—38, respectively, may be pressed, or otherwise inserted, into the soldering bumps 14—14 without softening or reflowing the latter. Substrate 20, including electrode pads 22—22 and/or electrode pads 34—34, may be lowered downwardly with sufficient force to enable the tips or apices 28 of electrode pads, or the tips or apices 44—44 of the conductor pins 38—38 of the electrode pads 34—34, to pierce the exterior surface (i.e., an oxide exterior surface) of the solder bumps 14—14 and enter therein. To facilitate complete encapsulation by the solder bumps 14—14 of the exterior or exposed surfaces of the electrode pads 22—22, or of the electrode pads 34—34, the solder bumps 14—14 may be subsequently softened or reflowed by elevating the temperature of the substrate 10 including the solder bumps 14—14. It is readily apparent that the electrode pads 34—34 of FIGS. 3 and 13 may be connected to the soldering bumps 14—14 by any procedure similar to the foregoing procedures.

Referring now to FIGS. 10, 11, and 14 for another embodiment of the present invention, there is seen the substrate 10 of FIG. 1 additionally having solid dielectric underfill 60 disposed thereon contiguous to opposed sides of the solder bumps 14—14, as best shown in FIG. 10. The dielectric underfill 60 may be disposed on substrate 10 by any suitable method, such as by screen printing as described in the book entitled *Microelectronics Packaging Handbook*, copyrighted 1997 by publisher Chapman & Hall, New York, N.Y., fully incorporated herein by reference thereto.

Dielectric underfill 60 may be any suitable dielectric underfill that preferably has a temperature (e.g., from about 50° C. to about 100° C.) that is lower than its curing or setting temperature, which preferably ranges from about 100° C. to about 150° C. Preferably, underfill 60 has a curing temperature (e.g., from about 20° C. to about 50° C.) higher than the reflow temperature of the soldering material of solder bumps 14—14. Also, it is preferred that the underfill 60 expand when heated, and remain at least partially expanded after cooling. Suitable dielectric underfill 60 include B-stage polyimides and/or eutectic solder material (e.g., here state chemical composition). Additional suitable dielectric underfill 60 include, as illustrated in U.S. Pat. No. 5,579,573 incorporated herein by reference thereto, thermosetting materials, such as high glass transition anhydride-cured epoxy compositions. More particular suitable thermoset materials include, but are not limited to, one or more compounds selected from group consisting of epoxies and modified epoxies, melamine-formaldehydes, urea formaldehydes, phelonic resins, poly(bis-maleimides), acetylene-terminated BPA resins, IPN polymers, triazine resins, and mixtures thereof. The thermoset material may be dispensed in an unpolymerized state onto the surface of substrate 10 and away from the solder bumps 14 as best shown in FIG. 10. As previously indicated, a subsequent heating step may be preferably necessary to partially react the dielectric underfill 60 into a "B-stageable" thermoplastic-like material (identified as "60a" below), capable of reflowing and curing the dielectric underfill 60 into a ternary matrix upon additional exposure to heat and pressure. Additional suitable dielectric underfill 60 may include high temperature thermoplastic materials such as liquid crystal polyesters (e.g., Xydar™ or Vectra™), poly-(ether ether ketones), or the poly(aryl ether ketones). Further additional suitable thermoplastic materials include, by way of example only, ABS-containing resinous materials (ABS/PC, ABS/polysulfone, ABS/PVC), acetals acrylics, alkyds, allylic ethers, cellulosic esters, chlorinated polyalkylene ethers, cyanate, cyanamides, furans, polyalkylene ethers, polyamides (Nylons), polyarylene ethers, polybutadienes, polycarbonates, polyesters, polyfluorocarbons, polyimides, polyphenylenes, polyphenylene sulfides, polypropylenes, polystyrenes, polysulfones, polyurethanes, polyvinyl acetates, polyvinyl chlorides, polyvinyl chloride/vinylidine chlorides, polyetherimides, polyether ether imides, and the like, and mixtures of any of the foregoing.

After the solid dielectric underfill 60 has been positioned on substrate 10 the electrode pads 22 are inserted into and coupled to the solder bumps 14—14 in accordance with any of the previously mentioned procedures, as best shown in FIG. 11. Subsequently, the dielectric underfill 60 may be heated to soften and flow the same to completely fill any voids or available space next to and/or between the solder bumps 14—14. Then, as shown in FIG. 14, the dielectric underfill 60 may be heated to a curing temperature, which preferably ranges from about 100° C. to about 150° C., to produce a cured dielectric underfill 60a. Thus, by the practice of embodiments of the present invention, there is no need to use flux for joining, or coupling together, substrates 10 and 20; and therefore, there would be no need for cleaning after joining or coupling the two substrates 10 and 20. Also, underfill may be placed on one of the substrates prior to joining or coupling the two substrates 10 and 20, and the underfill may be perfected (i.e., cured) after the joining or coupling. Furthermore, it is believed that the combination of pointy bond pads and solder bumps exert more surface tension than the combination of flat bond pads and solder bumps, thus providing improved self-alignment.

While the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope and spirit of the invention as set fourth. Therefore, many modifications may be made to adapt a particular situation or material to the teachings of the invention without departing from the essential scope and spirit of the present invention. It is intended that the invention not be limited to the particular embodiment disclosed as the best mode contemplated for carrying out this invention, but that the invention will include all embodiments and equivalents falling within the scope of the appended claims.

What is claimed is:

1. A method for electrically coupling electrode pads comprising the steps of:
   (a) forming a reflowed solder bump on a first electrode pad supported by a first substrate, said reflowed solder bump including a solder material having a melting temperature;
   (b) forming a second electrode pad on a second substrate, said second electrode pad including an electrode structure defined by at least one converging continuous arcuate surface terminating in an apex and having an electrode material whose melting temperature is greater than the melting temperature of the solder material, where said forming a second electrode pad comprises selectively removing electrode material from a layer of said electrode material by electrodissolution;
   (c) heating the solder bump to soften the solder material; and
   (d) pressing the apex of the second electrode pad into the heated solder bump to couple the first electrode pad to the second electrode pad.

2. The method of claim 1 additionally comprising disposing an underfill material on said first substrate prior to said heating step (c).

3. The method of claim 2 additionally comprising heating said underfill material after said pressing step (d).

4. The method of claim 3 wherein said underfill material includes a reflow temperature that is lower than its curing temperature.

5. The method of claim 3 where said underfill material comprises a curing temperature that is higher than a reflow temperature of the solder material.

6. The method of claim 3 wherein said heating of said underfill material additionally comprises expanding said underfill material.

7. The method of claim 6 additionally comprising cooling said underfill material after said heating of said underfill.

8. The method of claim 7 wherein said cooled underfill material remains at least partially expanded.

9. The method of claim 3 additionally comprising cooling said underfill material after said heating of said underfill.

10. The method of claim 9 wherein said cooled underfill material remains at least partially expanded.

11. The method of claim 2 wherein said underfill material includes a reflow temperature that is lower than its curing temperature.

12. The method of claim 2 wherein said underfill material comprises a curing temperature that is higher than a reflow temperature of the solder material.

13. The method of claim 11 additionally comprising forming said apex such that a pair of opposed continuous arcuate surfaces tangentially terminate in said apex.

14. The method of claim 1 wherein said apex has a diameter ranging from about 1.0 $\mu$m to about 5.0 $\mu$m.

15. A method for electrically coupling electrode pads comprising the steps of:
   (a) forming a reflowed solder bump on a first electrode pad supported by a first substrate, said reflowed solder bump including a solder material having a melting temperature;
   (b) forming a second electrode pad on a second substrate, said second electrode pad including an electrode structure defined by at least one converging continuous arcuate surface terminating in an apex and having an electrode material whose melting temperature is greater than the melting temperature of the solder material, where said forming a second electrode pad comprises immersing in an electrolyte said second substrate supporting electrode material from which said second electrode is to be formed;

(c) heating the solder bump to soften the solder material; and (d) pressing the apex of the second electrode pad into the heated solder bump to couple the first electrode pad to the second electrode pad.

16. The method of claim 15 wherein said forming step (b) additionally comprises employing a current density ranging from about 50 amps/m$^2$ to about 2000 amps/m$^2$.

17. The method of claim 16 wherein said electrolyte comprises an acid.

18. A method for electrically coupling electrode pads comprising the steps of:

(a) forming a reflowed solder bump on a first electrode pad supported by a first substrate, said reflowed solder bump including a solder material having a melting temperature;

(b) forming a second electrode pad on a second substrate, said second electrode pad including an electrode structure defined by at least one converging continuous arcuate surface terminating in an apex and having an electrode material whose melting temperature is greater than the melting temperature of the solder material, where said forming a second electrode pad additionally comprises passing current through an electrolyte;

(c) heating the solder bump to soften the solder material; and (d) pressing the apex of the second electrode pad into the heated solder bump to couple the first electrode pad to the second electrode pad.

19. A method for solder bump reflow comprising the steps of:

(a) forming a reflowed solder bump on a first electrode pad supported by a first substrate, said reflowed solder bump including a solder material having a melting temperature;:

(b) forming a second electrode pad on a second substrate, said second electrode pad including an electrode structure defined by at least one converging continuous arcuate surface terminating in an apex and having an electrode material whose melting temperature is greater than the melting temperature of the solder material, where said forming a second electrode pad additionally comprises passing current through an electrolyte;

(c) pressing the apex of the second electrode pad into said reflowed solder bump; and (d) reflowing the solder material of said reflowed solder bump.

* * * * *